US012211849B2

(12) United States Patent
Choi et al.

(10) Patent No.: US 12,211,849 B2
(45) Date of Patent: Jan. 28, 2025

(54) SUPER-STEEP SWITCHING DEVICE AND INVERTER DEVICE USING THE SAME

(71) Applicant: RESEARCH & BUSINESS FOUNDATION SUNGKYUNKWAN UNIVERSITY, Suwon-si (KR)

(72) Inventors: Hae Ju Choi, Suwon-si (KR); Tae Ho Kang, Seoul (KR); Chan Woo Kang, Incheon (KR); Hyeon Je Son, Suwon-si (KR); Jin Hong Park, Seoul (KR); Sung Joo Lee, Seongnam-si (KR); Sung Pyo Baek, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 18/598,689

(22) Filed: Mar. 7, 2024

(65) Prior Publication Data

US 2024/0213376 A1 Jun. 27, 2024

Related U.S. Application Data

(63) Continuation-in-part of application No. PCT/KR2022/013545, filed on Sep. 8, 2022.

(30) Foreign Application Priority Data

Sep. 8, 2021 (KR) .......................... 10-2021-0119491

(51) Int. Cl.
*H01L 29/786* (2006.01)
*H01L 27/06* (2006.01)
(Continued)

(52) U.S. Cl.
CPC ...... *H01L 27/0922* (2013.01); *H01L 27/0688* (2013.01); *H01L 29/0865* (2013.01);
(Continued)

(58) Field of Classification Search
CPC ............ H01L 27/0922; H01L 27/0688; H01L 29/0865; H01L 29/0882; H01L 29/41733;
(Continued)

(56) References Cited

U.S. PATENT DOCUMENTS

2008/0169465 A1 7/2008 Ko et al.
2021/0119044 A1* 4/2021 Shrivastava ........ H01L 29/7848

FOREIGN PATENT DOCUMENTS

JP 2011-165921 A 8/2011
KR 10-0804738 B1 2/2008
KR 10-0995535 B1 11/2010

OTHER PUBLICATIONS

Minsuk Kim et al. "impact-ionization and tunneling FET characteristics of dual-functional devices with partially covered intrinsic regions", IEEE Transactions on Nanotechnology, vol. 14, No. 4, Jul. 2015, pp. 633-637 (Year: 2015).*
Mahmut Tosun et al. "High-gaininverters based on WSe2 complementary field-effect transistors", ACS nano, vol. 8 No. 5, March (2014), pp. 4948-4953 (Year: 2014).*
Choi, Seunghyuk, et al., "2D channel device technology" Journal of Electronic Engineering, 2015, (9 pages in English, 9 pages in Korean).
(Continued)

*Primary Examiner* — Tong-Ho Kim
(74) *Attorney, Agent, or Firm* — NSIP Law

(57) ABSTRACT

A super-steep switching device is provided. The super-steep switching device may include a substrate, a semiconductor channel on the substrate, a source electrode and a drain electrode, which are disposed on the semiconductor channel and spaced apart from each other, a gate electrode overlapping a portion of the semiconductor channel and not overlapping a remaining portion of the semiconductor channel, and an insulating layer disposed between the gate electrode and the semiconductor channel and covering an entire surface of the semiconductor channel.

5 Claims, 15 Drawing Sheets

(51) Int. Cl.
  *H01L 27/092* (2006.01)
  *H01L 29/08* (2006.01)
  *H01L 29/24* (2006.01)
  *H01L 29/417* (2006.01)
  *H01L 29/423* (2006.01)
  *H02M 7/537* (2006.01)

(52) U.S. Cl.
  CPC .... *H01L 29/0882* (2013.01); *H01L 29/41733* (2013.01); *H01L 29/42384* (2013.01); *H01L 29/78696* (2013.01); *H02M 7/537* (2013.01); *H01L 29/24* (2013.01)

(58) Field of Classification Search
  CPC ......... H01L 29/42384; H01L 29/78696; H01L 29/24; H01L 21/8256; H01L 27/092; H01L 29/0665; H01L 29/778; H01L 29/78681; H01L 29/739; H01L 29/7391; H01L 27/085; H01L 29/20; H02M 7/537
  USPC .......................................................... 257/76
  See application file for complete search history.

(56) References Cited

OTHER PUBLICATIONS

Choi, W. Y. "Impact-Ionization Metal-Oxide-Semiconductor (I-MOS) Devices Using Avalanche Breakdown Mechanism." Seoul National University (2006): 1-169.

Kim, Minsuk, et al. "Impact-Ionization and Tunneling FET Characteristics of Dual-Functional Devices with Partially Covered Intrinsic Regions." IEEE Transactions on Nanotechnology 14.4 (2015): 633-637.

Tosun, Mahmut, et al. "High-Gain Inverters Based on WSe2 Complementary Field-Effect Transistors." ACS nano 8.5 (2014): 4948-4953.

Singh, Sangeeta, et al. "Analytical modeling of Schottky tunneling source impact ionization MOSFET with reduced breakdown voltage." Engineering Science and Technology, an International Journal 19.1 (2016): 421-428.

Chen, Yonghong, et al. "Thickness-dependent ferroelectric properties of HfO 2/ZrO 2 nanolaminates using atomic layer deposition." Journal of Materials Science 56 (2021): 6064-6072.

* cited by examiner

SUPER-STEEP SWITCHING DEVICE AND INVERTER DEVICE USING THE SAME

CROSS REFERENCE TO RELATED APPLICATION(S)

Pursuant to 35 USC 120 and 365(c), this application is a continuation of International Application No. PCT/KR2022/013545, filed on Sep. 8, 2022 which claims the benefit under 35 USC 119(a) and 365(b) of Korean Patent Application No. 10-2021-0119491, filed on Sep. 8, 2021 in the Korean Intellectual Property Office, the entire disclosure of which is incorporated herein by reference for all purposes.

FIELD

The present disclosure relates to a super-steep switching device using avalanche carrier multiplication phenomenon and an inverter device using the same.

DESCRIPTION OF RELATED ART

In a conventional CMOS-based information processing device, excessive power loss/consumption due to high integration of the device has caused a power management problem, and performance thereof per watt has reached a limit thereof.

Accordingly, efforts to overcome fundamental thermionic limit of the conventional CMOS-based information processing device are progressing at each of material, device, and architecture levels. For example, a steep-switching device such as a tunneling FET, a negative capacitance FET, and an I-MOS may be used.

However, the above-described devices cause problems such as low reliability and instability due to problems such as high operation voltage required for operation of the devices, and damage of hot electrons caused by the high operation voltage to insulators and interfaces. In reality, a steep-switching device capable of operating at room temperature has not been realized.

DISCLOSURE

Technical Purpose

One purpose of the present disclosure is to provide a super-steep switching device having a very low SS (Sub-threshold Swing) value even at room temperature using avalanche carrier multiplication phenomenon.

Another purpose of the present disclosure is to provide an inverter device using the super-steep switching device.

Technical Solution

A first aspect of the present disclosure provides a super-steep switching device comprising: a semiconductor channel disposed on a substrate and made of a semiconductor material having impact ionization characteristic; a source electrode and a drain electrode in contact with the semiconductor channel, wherein the source electrode and the drain electrode are disposed on the substrate and are spaced apart from each other; and a gate electrode disposed on the semiconductor channel so as to overlap only a portion of the semiconductor channel, wherein a top surface of the semiconductor channel includes a first area overlapping the gate electrode, and a second area non-overlapping the gate electrode, wherein a ratio of a length of the first area and a length of the second area is in a range of 1:0.1 to 0.4

In one implementation of the super-steep switching device, a voltage for generating an electric field having an intensity higher than a critical electric field intensity, and lower than a breakdown electric field intensity is applied to the drain electrode, wherein the critical electric field intensity is a minimum electric field intensity at which avalanche carrier multiplication occurs in the first area, wherein the breakdown electric field intensity is an electric field intensity at which breakdown occurs in the first area.

In one implementation of the super-steep switching device, a gate voltage is applied to the gate electrode simultaneously with the application of the voltage to the drain electrode, such that the avalanche carrier multiplication phenomenon occurs in the first area.

In one implementation of the super-steep switching device, the super-steep switching device exhibits a sub-threshold swing (SS) value smaller than or equal to 5 mV/dec at room temperature using the avalanche carrier multiplication phenomenon occurring in the first area.

In one implementation of the super-steep switching device, the gate electrode overlaps the portion of the semiconductor channel closer to the source electrode than to the drain electrode.

In one implementation of the super-steep switching device, the second area has the length in a range of 5 to 400 nm.

In one implementation of the super-steep switching device, the semiconductor channel is made of one two-dimensional semiconductor material selected from a group consisting of black phosphorus (BP), tungsten diselenide ($WSe_2$), indium selenide (InSe), molybdenum disulfide ($MoS_2$), boron arsenide (BAs), indium selenide ($In_2Se_3$), zirconium diselenide ($ZrSe_2$), and hafnium diselenide ($HfSe_2$).

A second aspect of the present disclosure provides an inverter device comprising: the super-steep switching device of the first aspect; and a pull-up transistor connected in series with the super-steep switching device, wherein the pull-up transistor is configured to perform a complementary operation with the super-steep switching device.

In one implementation of the inverter device, a gate electrode of the pull-up transistor and the gate electrode of the super-steep switching device are electrically connected to each other so that the same gate voltage is applied thereto.

In one implementation of the inverter device, a semiconductor layer of the pull-up transistor is made of a p-type or n-type semiconductor material capable of performing a complementary operation with the super-steep switching device, wherein the p-type semiconductor material includes one selected from a group consisting of black phosphorus (BP), tungsten diselenide ($WSe_2$), boron arsenide (BAs) and tellurium, wherein the n-type semiconductor material includes one selected from a group consisting of molybdenum disulfide ($MoS_2$), indium selenide ($In_2Se_3$), rhenium disulfide ($ReS_2$) and molybdenum diselenide ($MoSe_2$).

In one embodiment, the super-steep switching device may include a substrate, a semiconductor channel on the substrate, a source electrode and a drain electrode, which are disposed on the semiconductor channel and spaced apart from each other, a gate electrode overlapping a portion of the semiconductor channel and not overlapping a remaining portion of the semiconductor channel, and an insulating layer disposed between the gate electrode and the semiconductor channel and covering an entire surface of the semiconductor channel.

In one embodiment, an upper surface of the semiconductor channel may include a first area overlapping the gate electrode, and a second area not overlapping the gate electrode.

In one embodiment, the source electrode may cover a first side wall adjacent to a first side of the semiconductor channel and an edge adjacent to the first side, and the drain electrode may cover a second side wall adjacent to a second side opposite to the first side of the semiconductor channel and an edge adjacent to the second side.

In one embodiment, the insulating layer may cover a portion of the source electrode covering the edge adjacent to the first side of the semiconductor channel, and may cover a portion of the drain electrode covering the edge adjacent to the second side of the semiconductor channel.

In one embodiment, the gate electrode may overlap a portion of the semiconductor channel adjacent to the source electrode, and may not overlap a remaining portion of the semiconductor channel adjacent to the drain electrode.

In one embodiment, the semiconductor channel may include a two-dimensional semiconductor material.

In one embodiment, the semiconductor channel may have an impact ionization property.

In one embodiment, the semiconductor channel may have a band gap of 0.3 to 1.9 eV.

In one embodiment, the semiconductor channel may be formed of $WSe_2$.

In one embodiment, the inverter device may include a super-steep switching device according to the above-described embodiments, and a pull-up transistor connected in series with the super-steep switching device and capable of operating complementarily with the super-steep switching device.

Technical Effect

In the super-steep switching device according to the present disclosure, the gate area is controlled using a structure in which the gate electrode overlaps only the portion of the semiconductor channel having the impact ionization characteristic. The gate voltage gradually increases while the electric field having the intensity greater than the critical electric field intensity is applied to the semiconductor channel. Thus, the probability of occurrence of avalanche carrier multiplication may increase. As a result, the number of charge carriers generated in the semiconductor channel may be significantly increased. As a result, the super-steep switching device having a very low SS (Subthreshold Swing) value may be implemented even at room temperature.

Further, according to the present disclosure, the inverter device having a high inverter gain and ideal noise margin based on the super-steep switching phenomenon using a simple series connection circuit configuration between the super-steep switching device and the pull-up transistor capable of performing the complementary operation with the super-steep switching device may be implemented.

Figure 3:
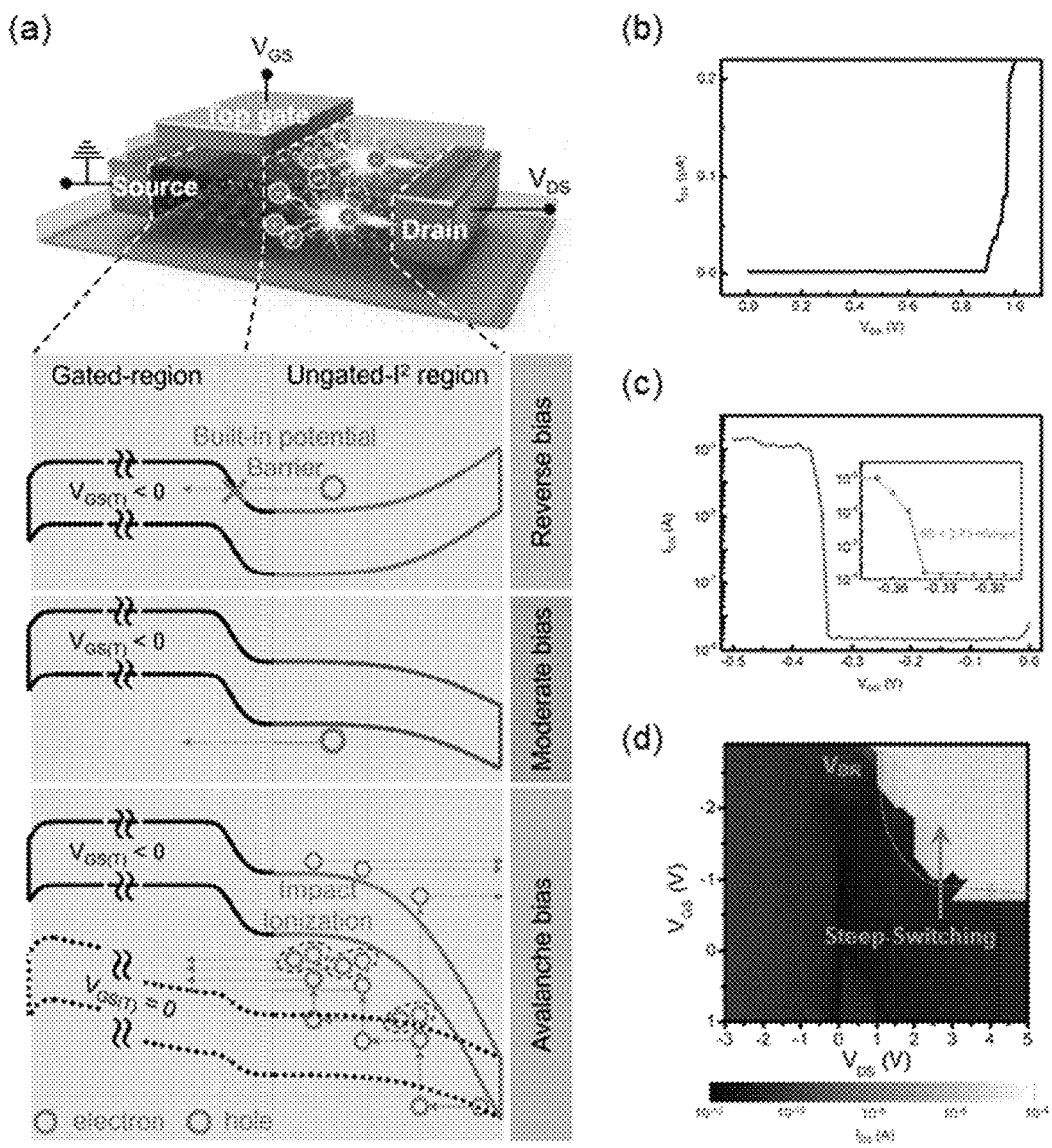

(a) in FIG. 3 shows a schematic diagram of a $WSe_2$ homojunction transistor-based super-steep switching device according to one embodiment of the present disclosure, and a band structure diagram that changes based on a drain voltage and a top gate voltage. (b) and (c) in FIG. 3 are graphs respectively showing output characteristic (ID-VD) and transfer characteristic (ID-VG) exhibiting a sudden increase in current based on the impact ionization phenomenon. (d) in FIG. 3 is a contour diagram of a channel current that changes based on a drain voltage and a top gate voltage.

Figure 4:
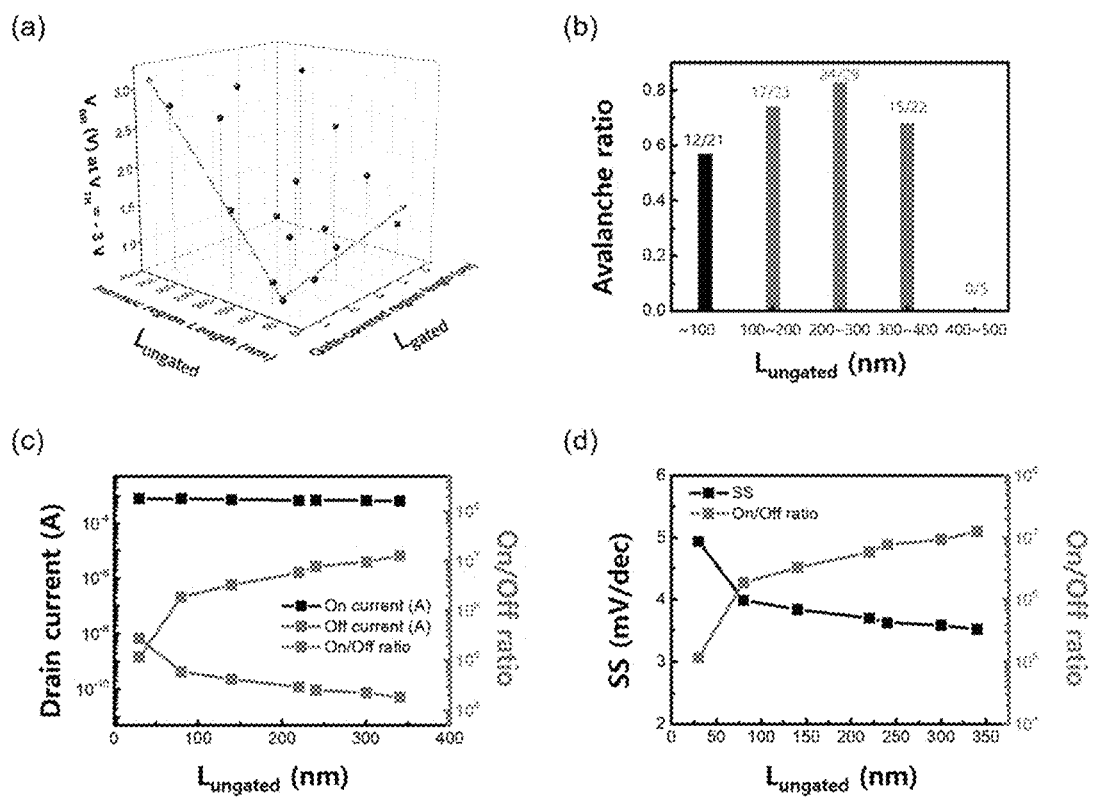

(a) in FIG. 4 is a graph showing change in critical voltage $V_{BR}$ based on change in the length of the first area (Gated region) overlapping the gate electrode and in the length of the second area (Ungated $I^2$ region) non-overlapping the gate electrode. (b) in FIG. 4 is a graph showing a probability of occurrence of impact ionization based on a change in a ratio of the length of the second area to the length of the first area. (c) in FIG. 4 is a graph showing the change in the on/off current based on the change in a ratio of the length of the second area to the length of the first area. (d) in FIG. 4 is a graph showing the change in the on/off ratio and SS (Subthreshold Swing) value based on the change in a ratio of the length of the second area to the length of the first area.

Figure 5:
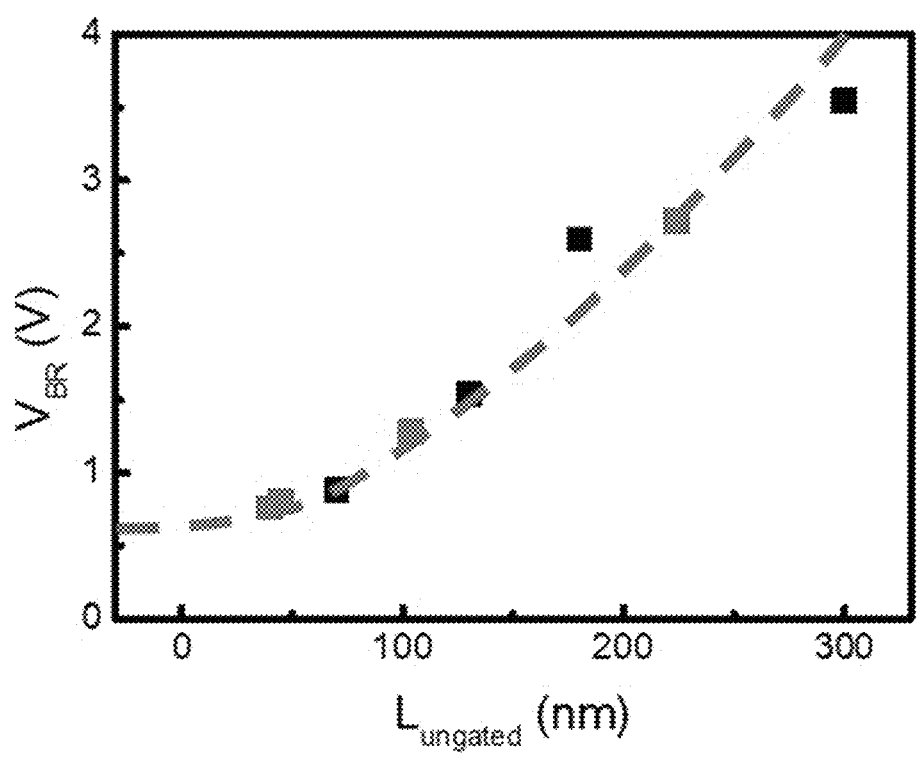

FIG. 5 is a graph showing a change in breakdown voltage ($V_{BR}$) according to a change in a length ($L_{ungated}$, nm) of the second area under the same $V_{GS}$ condition (−3 V).

Figure 6:
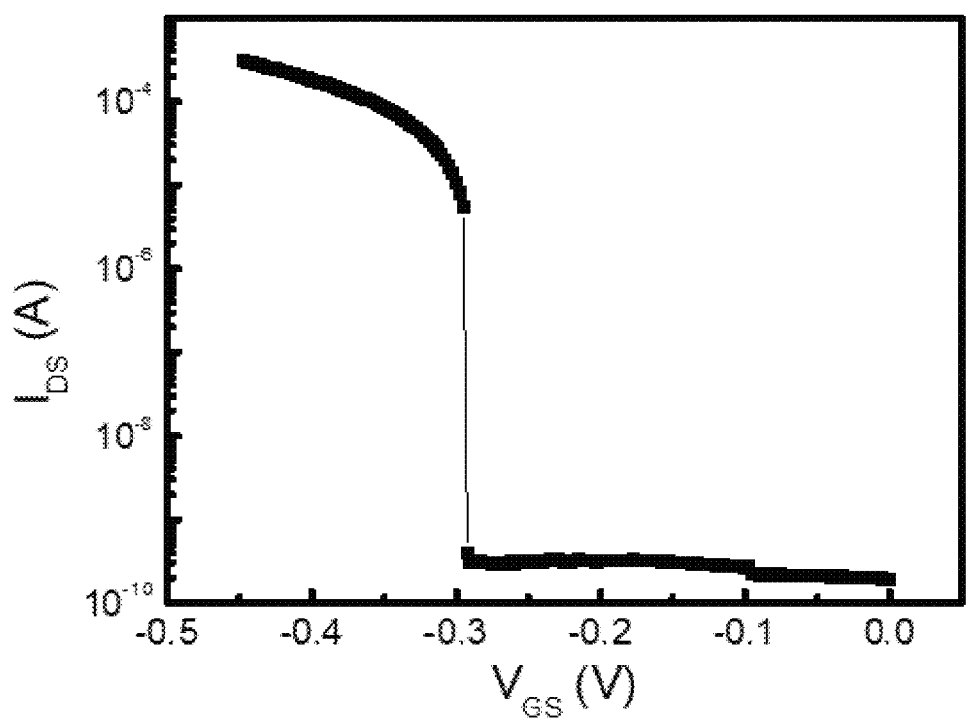

FIG. 6 is a graph showing $I_{DS}$ according to $V_{GS}$ under a condition of having $V_{DS}$ of 3 V and the second area length ($L_{ungated}$) of 45 nm.

Figure 7:
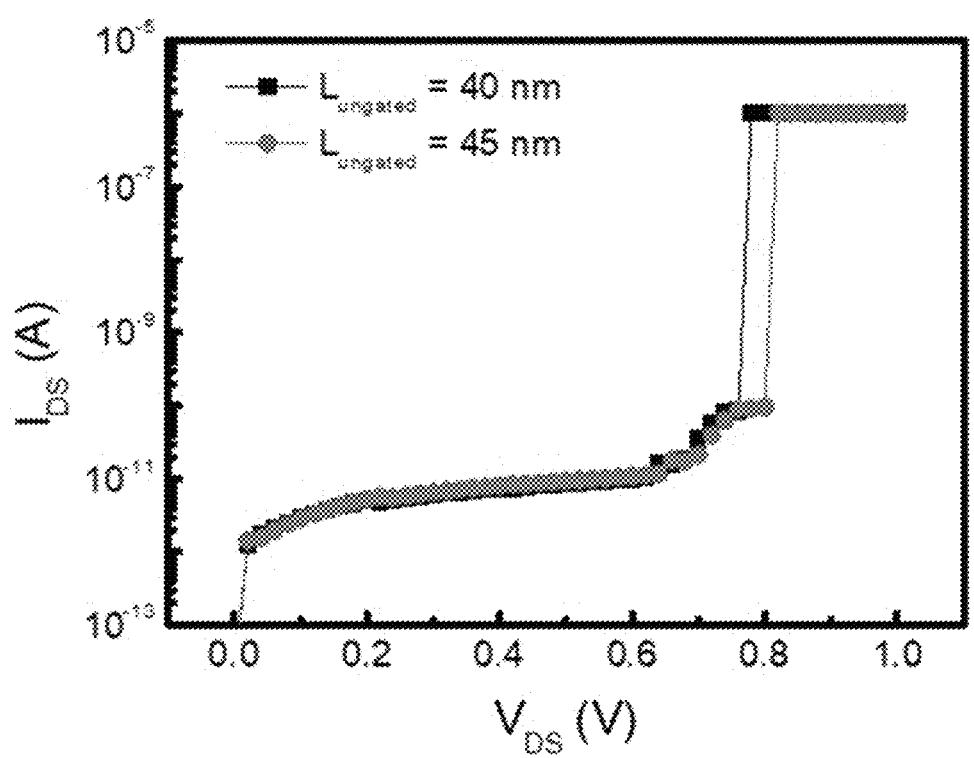

FIG. 7 is a graph showing $I_{DS}$ according to $V_{DS}$ under each of a condition of having $V_{DS}$ of 3 V and the second area length ($L_{ungated}$) of 40 nm and a condition of having $V_{DS}$ of 3 V and the second area length ($L_{ungated}$) of 45 nm.

Figure 8:
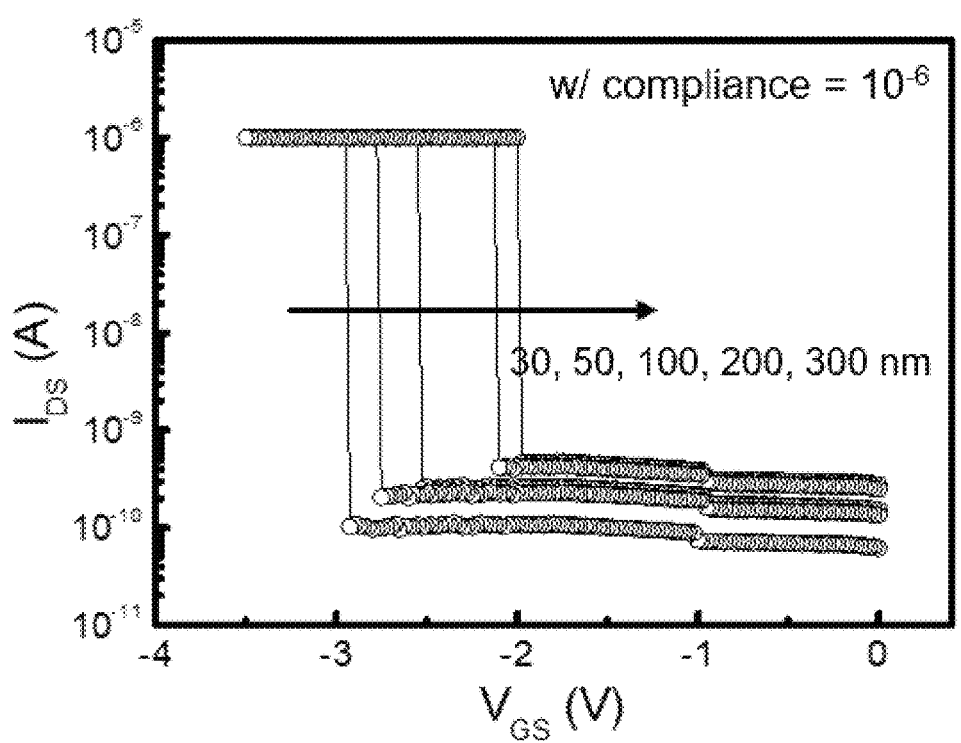

FIG. 8 is a graph showing a change in threshold voltage according to a change in the length of the second area.

Figure 9:
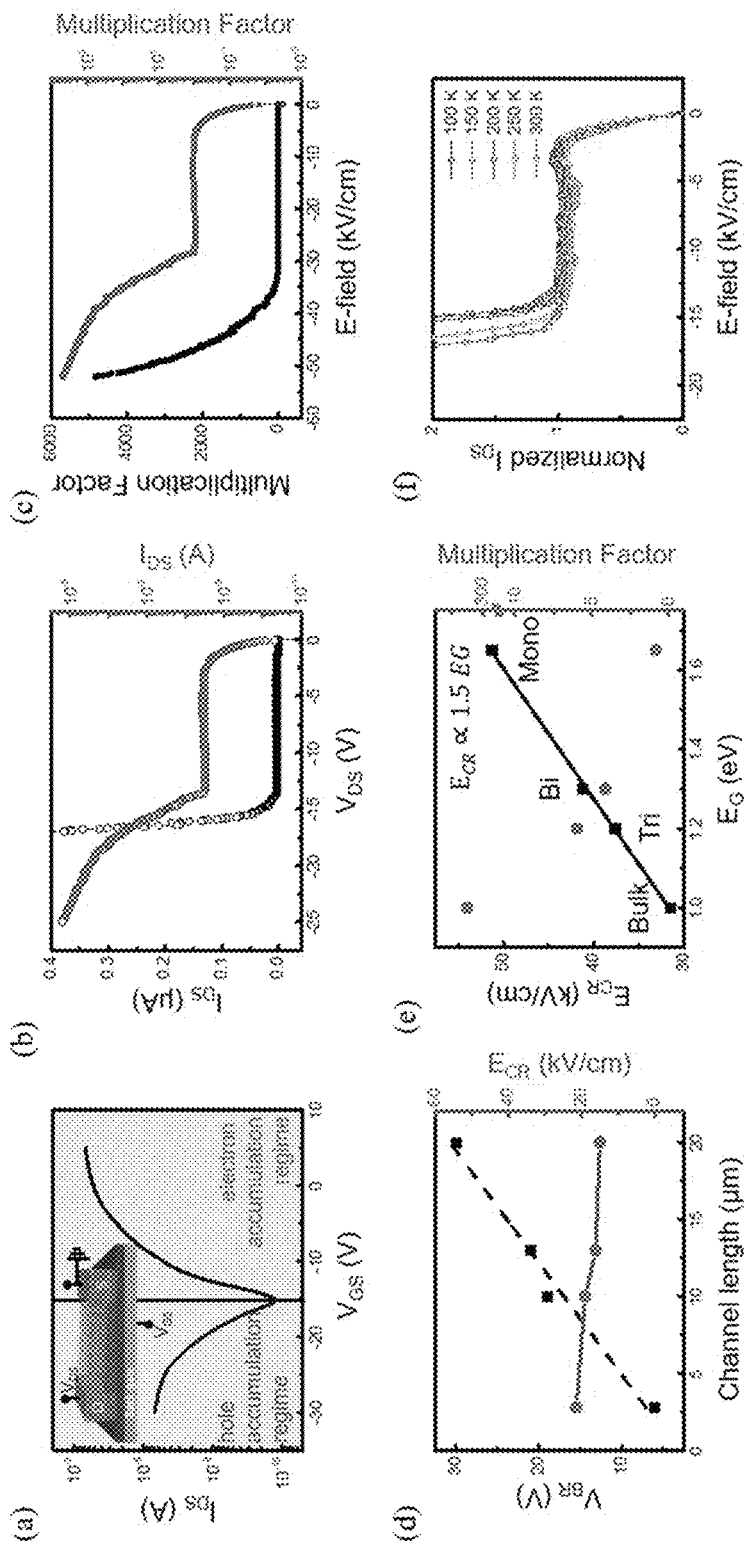

(a) and (b) in FIG. 9 are respectively graphs showing transfer characteristic (ID-VG) and output characteristic (ID-VD) of $WSe_2$ having impact ionization characteristic. (c) in FIG. 9 is a graph of the multiplication factor based on the electric field (E-field) calculated from the output characteristic (ID-VD). (d) in FIG. 9 is a graph showing the change in the critical voltage $V_{BR}$ and the critical electric field intensity $E_{CR}$ based on the length of the semiconductor channel according to the present disclosure. (e) in FIG. 9 is a graph showing the change in the critical electric field intensity $E_{CR}$ and the change in the multiplication factor under the same electric field (E=52 kV/cm) based on a thickness of the semiconductor channel according to the present disclosure. (f) in FIG. 9 is a graph showing the change in drain current-electric field based on a temperature.

Figure 10:
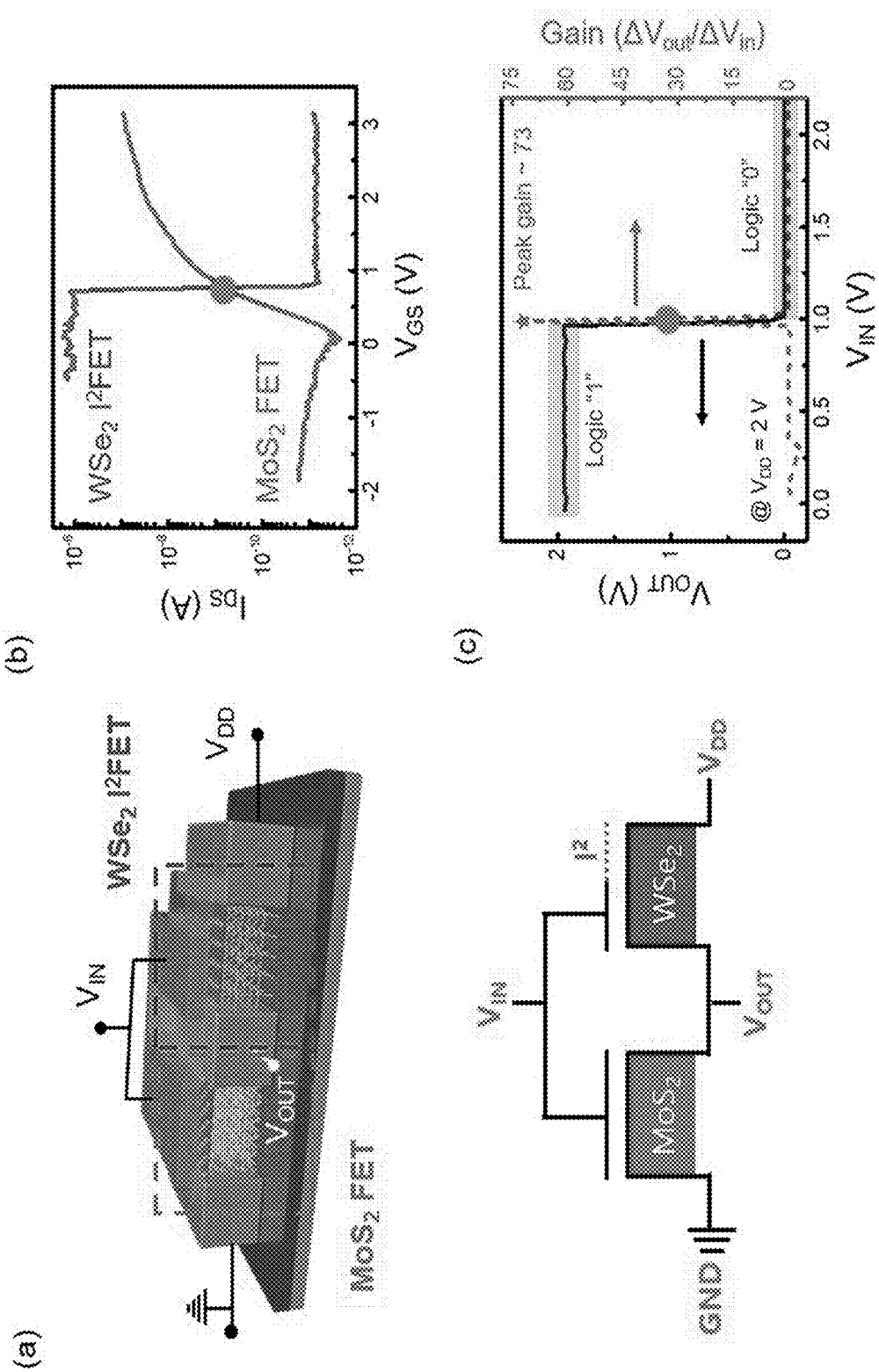

(a) in FIG. 10 is a schematic diagram and a circuit diagram of an inverter device according to one embodiment of the present disclosure in which a super-steep switching device and a pull-up transistor capable of performing a complementary operation therewith are connected in series with each other. In this regard, $V_{In}$ denotes the top gate voltage and $V_{out}$ denotes an output voltage between two transistors.

(b) in FIG. 10 is a graph showing the transfer characteristic (ID-VG) of the inverter device according to one embodiment of the present disclosure. (c) in FIG. 10 shows the $V_{out}$-$V_{in}$ curve of the inverter device.

Figure 11:
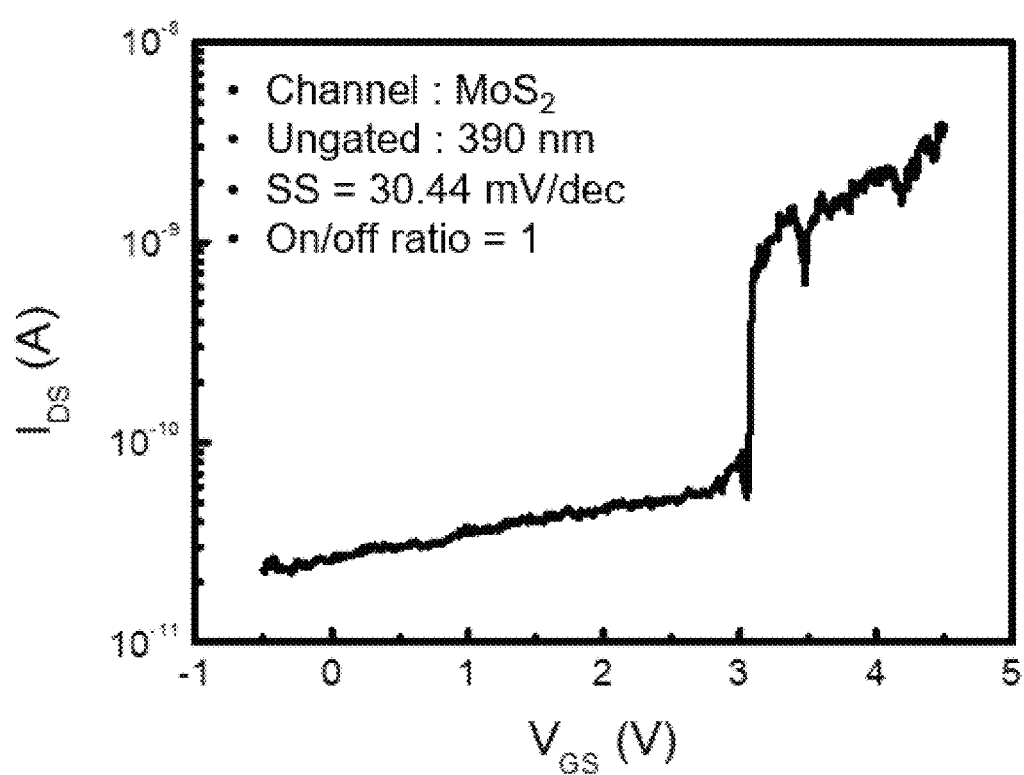

FIG. 11 is a graph showing an $I_{DS}$ measured according to $V_{GS}$ for a device having a semiconductor channel material MoS$_2$, a semiconductor channel length of 2.5 μm, a semiconductor channel width of 5 μm, and a second area (Ungated) length of 390 nm.

Figure 12:
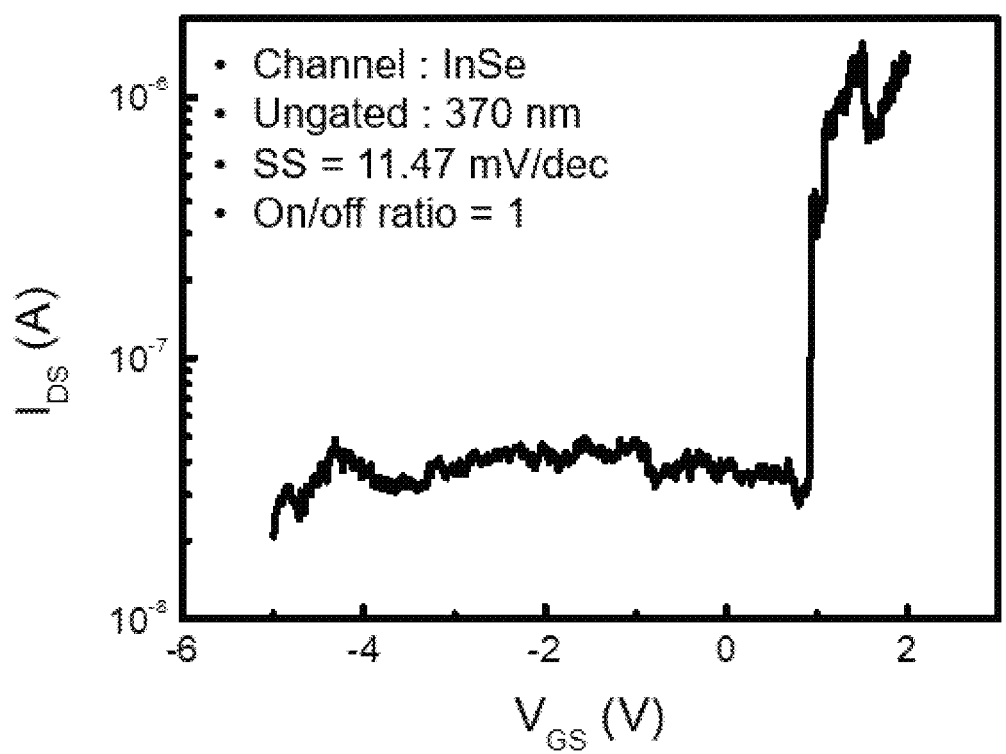

FIG. 12 is a graph showing an $I_{DS}$ measured according to $V_{GS}$ for a device having a semiconductor channel material InSe, a semiconductor channel length of 5 μm, a semiconductor channel width of 3.5 μm, and a second area (U$_{ngated}$) length of 370 nm.

Figure 13:
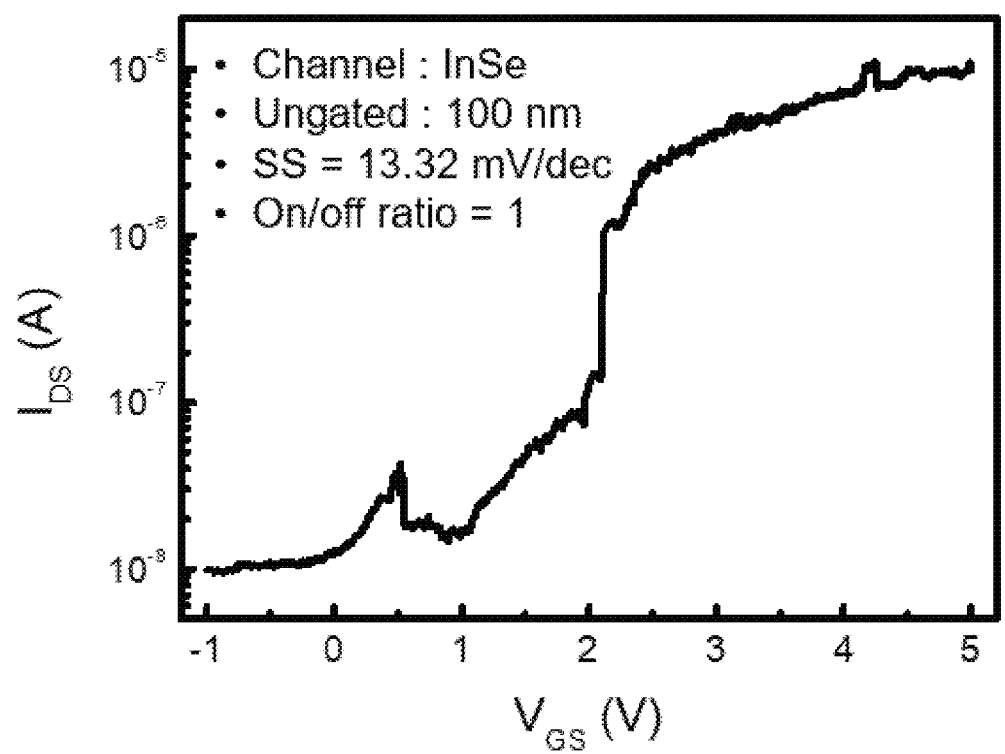

FIG. 13 is a graph showing an $I_{DS}$ measured according to $V_{GS}$ for a device having a semiconductor channel material InSe, a semiconductor channel length of 5 μm, a semiconductor channel width of 2.5 μm, and a second area (Ungated) length of 100 nm.

Figure 14:
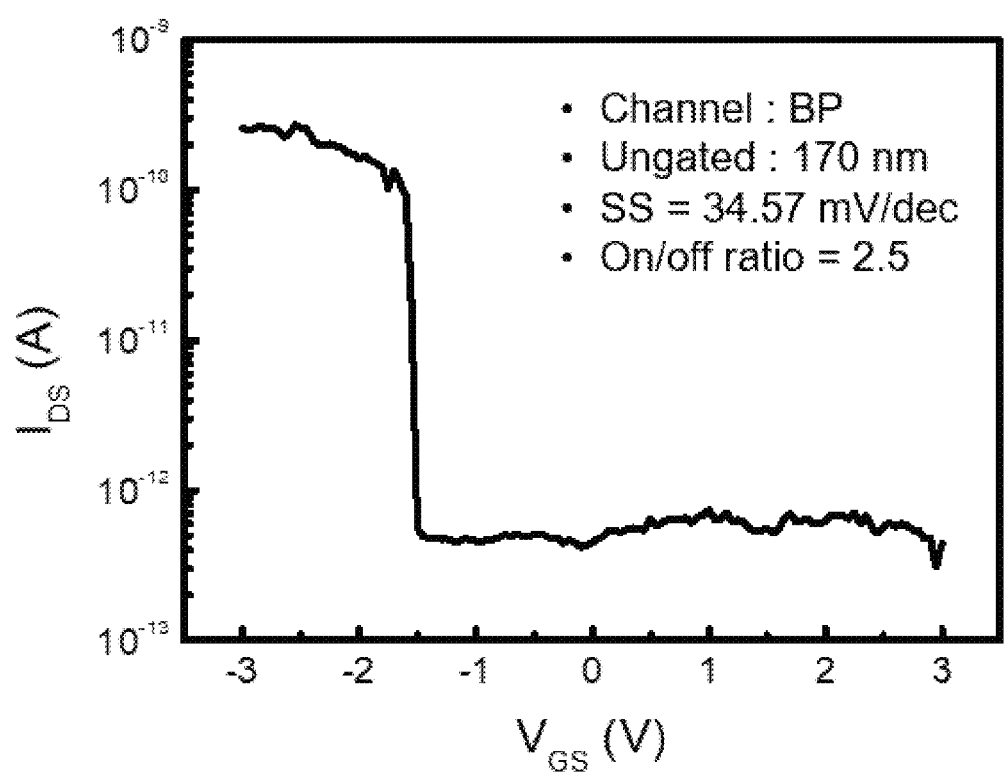

FIG. 14 is a graph showing an $I_{DS}$ measured according to $V_{GS}$ for a device having a semiconductor channel material BP, a semiconductor channel length of 5.5 μm, a semiconductor channel width of 1 μm, and a second area (Ungated) length of 170 nm.

Figure 15:
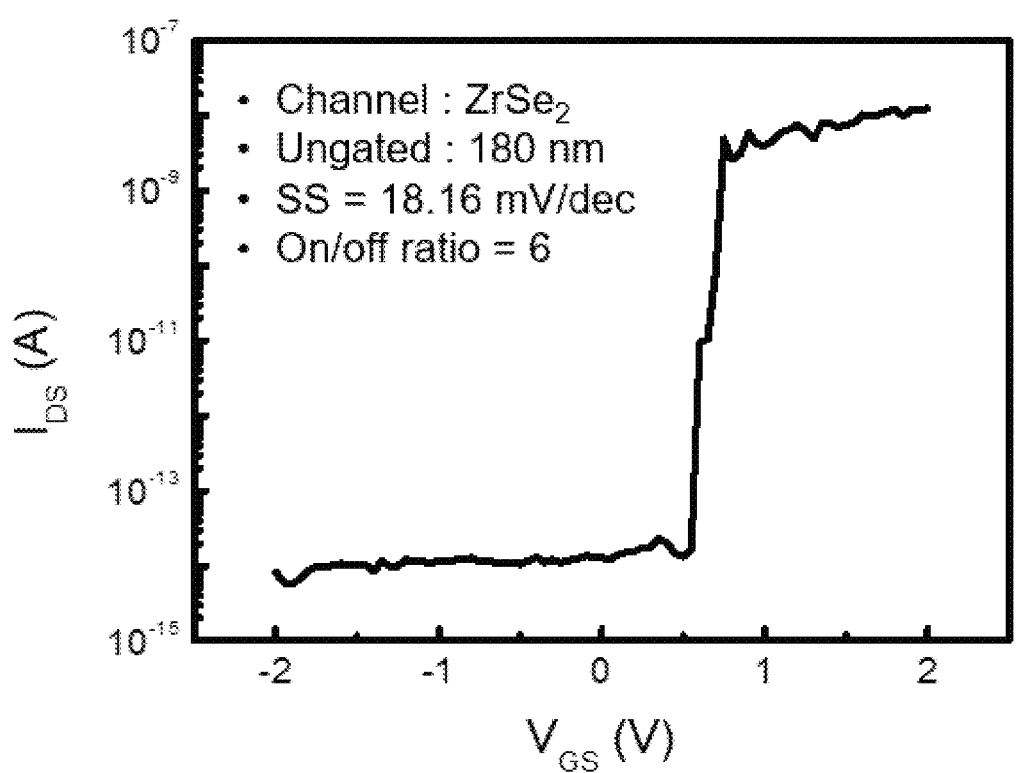

FIG. 15 is a graph showing an $I_{DS}$ measured according to $V_{GS}$ for a device having a semiconductor channel material ZrSe$_2$, a semiconductor channel length of 1 μm, a semiconductor channel width of 0.5 μm, and a second area (Ungated) length of 180 nm.

Figure 16:
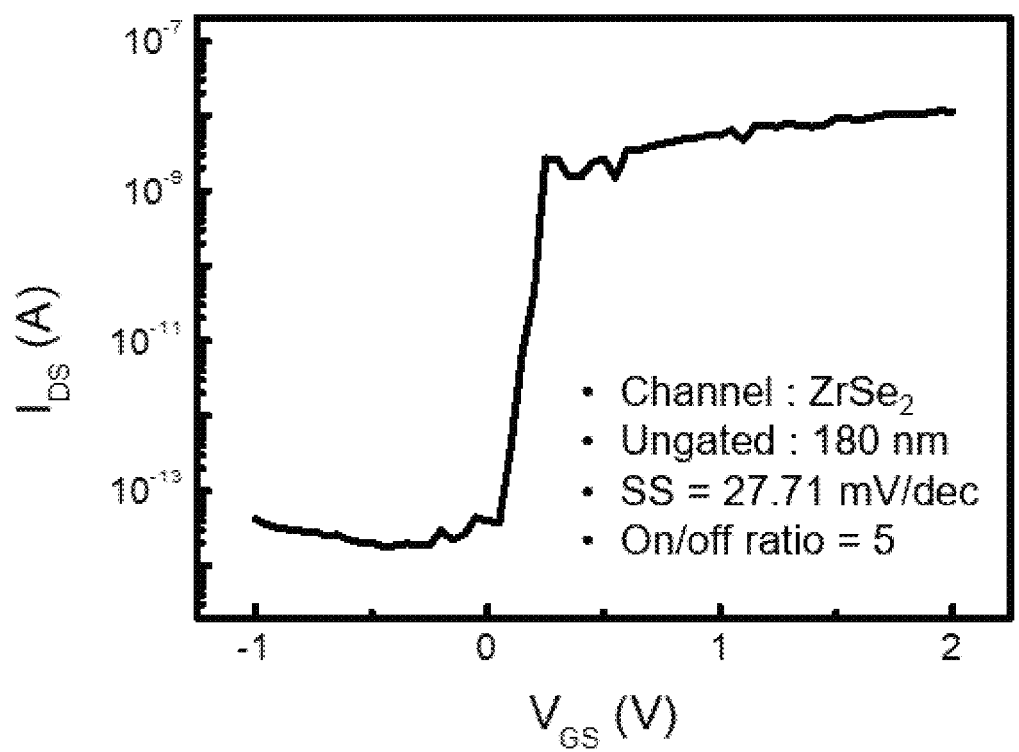

FIG. 16 is a graph showing an $I_{DS}$ measured according to $V_{GS}$ for a device having a semiconductor channel material ZrSe$_2$, a semiconductor channel length of 1 μm, a semiconductor channel width of 0.5 μm, and a second area (Ungated) length of 180 nm.

DETAILED DESCRIPTIONS

Hereinafter, an embodiment of the present disclosure will be described in detail with reference to the accompanying drawings. In the present disclosure, various changes may be made. The present disclosure may have various forms. Thus, specific embodiments may be illustrated in the drawings and may be described in detail herein. However, the embodiments are not intended to limit the present disclosure to a specific form. It should be understood that the present disclosure may include all changes, equivalents or substitutes included in the spirit and scope of the present disclosure. In illustrating the drawings, like reference numerals have been used for like elements.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
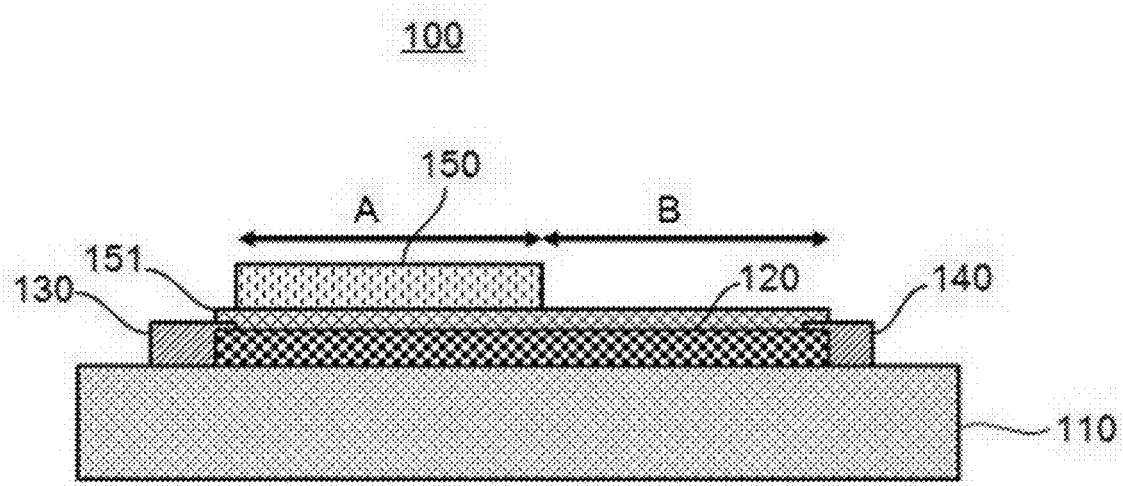
FIG. 1 is a cross-sectional view for illustrating a super-steep switching device according to one embodiment of the present disclosure.

FIG. 1 is a cross-sectional view for illustrating a super-steep switching device according to one embodiment of the present disclosure.

Referring to FIG. 1, a super-steep switching device 100 according to one embodiment of the present disclosure may include a substrate 110, a semiconductor channel 120, a source electrode 130, a drain electrode 140, and a gate electrode 150.

A type of the substrate 110 is not particularly limited as long as the substrate may support the semiconductor channel 120, the source electrode 130, and the drain electrode 140 thereon. For example, the substrate 110 may include one selected from a metal having an insulating film formed on a surface thereof, a semiconductor substrate, a ceramic substrate, a polymer substrate, and the like.

The semiconductor channel 120 may be disposed on the substrate 110. The semiconductor channel 120 may be made of a semiconductor material having impact ionization characteristic. The semiconductor channel 120 may be made of a p-type semiconductor material or an n-type semiconductor material. For example, the semiconductor channel 120 is made of a two-dimensional p-type semiconductor material such as black phosphorus (BP), tungsten diselenide (WSe$_2$), boron arsenide (BAs), or etc. or may be made of a two-dimensional n-type semiconductor material such as indium selenide (InSe), molybdenum disulfide (MoS$_2$), indium selenide (In$_2$Se$_3$), zirconium diselenide (ZrSe$_2$), hafnium diselenide (HfSe$_2$), etc.

In one embodiment, the semiconductor channel 120 may be made of a material having a relatively low bandgap. This is because, as the band gap of the semiconductor channel 120 is smaller, an intensity of a critical electric field intensity that causes avalanche carrier multiplication, which will be described below, may be reduced. For example, the semiconductor channel 120 may be made of a semiconductor material having a bandgap of about 0.3 to 1.9 eV.

The source electrode 130 and the drain electrode 140 may be in contact with the semiconductor channel 120 while being disposed on the substrate 110 and being spaced apart from each other. An area of the semiconductor channels 120 between the source electrode 130 and the drain electrode 140 may constitute a channel through which current may flow. Each of the source and drain electrodes 130 and 140 may be made of an electrically conductive material.

The gate electrode 150 may be disposed on the semiconductor channel 120 so as to overlap only a portion of the semiconductor channel 120, and may receive a voltage so as to generate an electric field in the semiconductor channel 120. In one embodiment, the gate electrode 150 may be disposed so as to overlap only a portion of the semiconductor channel 120 adjacent to the source electrode 130. Further, an insulating layer 151 may be formed between the gate electrode 150 and the semiconductor channel 120.

In one embodiment, a top surface of the semiconductor channel 120 may include a first area A overlapping the gate electrode 150, and a second area B non-overlapping the gate electrode 150. A ratio of a length of the first area A and a length of the second area B may be adjusted to control characteristic of the super-steep switching device.

In one embodiment, in a device structure in which the first area A and the second area B are formed, a voltage for generating an electric field having an intensity greater than a minimum electric field intensity (hereinafter, referred to as a 'critical electric field intensity') at which the avalanche multiplication occurs in the first area A may be applied to the drain electrode 140.

Further, a voltage may be applied to the gate electrode 150 simultaneously with the voltage application to the drain electrode 140. As the gate voltage gradually increases, the avalanche carrier multiplication phenomenon may occur in the first area A. That is, while the electric field having the intensity above the critical electric field intensity is applied to the first area A under the voltage application to the drain electrode 140, the gate voltage is gradually increased to generate the avalanche carrier multiplication, thereby implementing super-steep switching phenomenon at room temperature.

When the electric field is applied to the first area A, the charge carriers are accelerated in the first area A. In general, the velocity of the charge carriers does not increase indefinitely. Rather, due to impact thereof with the lattice, the velocity of the charge carriers is saturated at a constant level. However, when a sufficiently strong electric field, that is, an electric field having the intensity larger than the critical electric field intensity is applied, the charge carriers sufficiently accelerated under the electric field collide with the lattice to cause an electron in the valence band to transfer to the conduction band, such that a new electron-hole pair is created. The new electron-hole pair again acquires high energy to continuously generate additional electron-hole pairs, and thus the carrier density may be greatly increased. In the present disclosure, the avalanche multiplication means that carriers are multiplicated under the impact ionization as described above, and the critical electric field intensity indicates the minimum electric field intensity at which the avalanche multiplication occurs.

In one embodiment, regarding dark current change characteristic based on the electric field to the first area A, when the electric field having an intensity below the critical electric field intensity is applied to the first area A, a magnitude of the dark current generated in the first area A increases linearly based son the intensity of the applied electric field. To the contrary, when an electric field having an intensity larger than the critical electric field intensity is applied thereto, the magnitude of the dark current generated in the first area A increases in a superlinear manner due to the avalanche multiplication. Accordingly, the critical electric field intensity may refer to an electric field intensity at a point where behavior of the dark current changes from a linear manner to the superlinear manner in the dark current change characteristic based son the electric field for the first area A.

In this regard, when the intensity of the electric field applied to the first area A greater than the critical electric field intensity continuously increases, breakdown of the first area A occurs. Accordingly, the drain electrode 140 may apply, to the semiconductor channel 120, an electric field having an intensity that is greater than the critical electric field intensity and is lower than the intensity of the electric field at which breakdown of the semiconductor channel 120 occurs.

In one example, as described above, according to the present disclosure, the ratio of the length of the first area A and the length of the second area B may be controlled to implement the super-steep switching device that exhibits a low SS (Subthreshold Swing) value even at room temperature. In this regard, the SS (Subthreshold Swing) means a $V_{GS}$ value required to increase a drain-source current $I_{DS}$ by 10 times in a field effect transistor.

In one embodiment, the second area B may have a length greater than 5 nm so that a tunneling phenomenon does not occur therein, and may have the length smaller than 400 nm so that steep switching may be possible. The second area B may have a length smaller than 400 nm so that a steep-switching phenomenon does not occur therein. For an optimized operation of the super-steep switching device according to this embodiment, the ratio of the length of the first area A and the length of the second area B may be in a range of 1:0.1 to 0.4.

When the ratio of the length of the second area to the length of the first area A is smaller than 0.1, an off current increases such that an on/off ratio decreases as, and thus the SS value increases, and thus, probability of occurrence of impact ionization decreases. On the contrary, when the ratio of the length of the second area B to the length of the first area A exceeds 0.4, the steep-switching does not occur.

However, in the super-steep switching device of this embodiment, a length of a gate area of the semiconductor channel 120 having impact ionization characteristic may be adjusted as described above, thereby increasing the probability of occurrence of the avalanche carrier multiplication phenomenon occurring in the first area A, and thus, significantly increasing the number of charge carriers generated in the semiconductor channel 120. As a result, the super-steep switching device having a very low (5 mV/dec or lower) SS (Subthreshold Swing) value even at room temperature and having an optimized On/Off ratio may be implemented.

Figure 2:
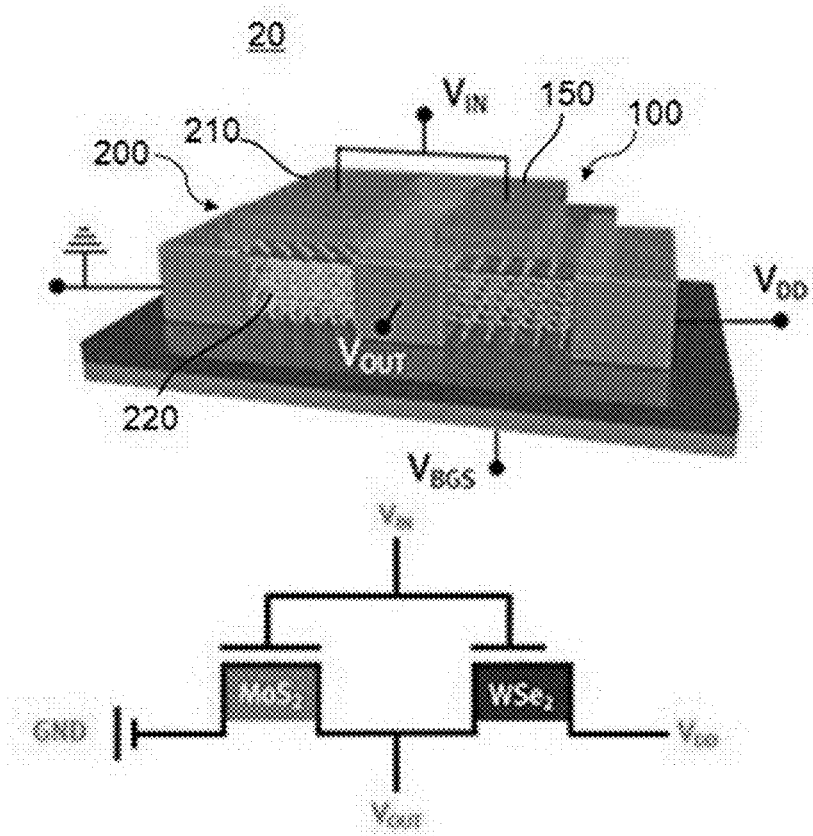
FIG. 2 is a schematic diagram and a circuit diagram of an inverter device according to one embodiment of the present disclosure. In this regard, $V_{In}$ denotes a top gate voltage and $V_{out}$ denotes an output voltage between two transistors.

FIG. 2 is a schematic diagram and a circuit diagram of an inverter device according to one embodiment of the present disclosure.

Referring to FIG. 2, an inverter device 20 according to one embodiment of the present disclosure may include the super-steep switching device 100 and a pull-up transistor 200.

The super-steep switching device 100 includes the configuration as described above. Thus, the description thereof will be omitted.

The pull-up transistor 200 may be connected in series with the super-steep switching device 100 and may operate in a complementary manner to the super-steep switching device 100.

In one embodiment, a gate electrode 210 of the pull-up transistor 200 and the gate electrode 150 of the super-steep switching device 100 are electrically connected to each other. Thus, the same gate voltage may be applied thereto.

In one embodiment, a semiconductor layer 220 of the pull-up transistor 200 may be made of an n-type semiconductor material capable of performing a complementary operation with the super-steep switching device. For example, the semiconductor layer 220 of the pull-up transistor 200 may be made of an n-type semiconductor material such as molybdenum disulfide ($MoS_2$), indium selenide ($In_2Se_3$), rhenium disulfide ($ReS_2$), or molybdenum diselenide ($MoSe_2$).

In one embodiment, the semiconductor layer 220 of the pull-up transistor 200 may be made of a p-type semiconductor material capable of performing a complementary operation with the super-steep switching device. For example, the semiconductor layer 220 of the pull-up transistor 200 may be made of a p-type semiconductor material such as black phosphorus (BP), tungsten diselenide ($WSe_2$), boron arsenide (BAs), or tellurium.

The inverter device 20 according to the present disclosure may exhibit a high inverter gain and ideal noise margin characteristic based on the super-steep switching phenomenon, due to a simple series connection circuit configuration between the super-steep switching device 100 and the pull-up transistor 200 that may operate in a complementary manner to the super-steep switching device 100.

Hereinafter, Examples of the present disclosure will be described in detail. However, the following Examples are only some examples of the present disclosure, and the scope of the present disclosure is not limited to the following Examples.

Example 1: Characteristics of Super-Steep Switching Device (a) in FIG. 3 shows a schematic diagram of a $WSe_2$ homojunction transistor-based super-steep switching device according to one embodiment of the present disclosure, and a band structure diagram that changes based on a drain voltage and a top gate voltage.

Referring to (a) in FIG. 3, it may be identified that when sufficiently high drain voltage (Avalanche bias) and top gate voltage are applied, the impact ionization occurs in the second area (Ungated $I^2$ region) non-overlapping the gate electrode.

Further, (b) and (c) in FIG. 3 show output characteristic (ID-VD) and transfer characteristic (ID-VG), respectively, exhibiting a rapid increase in current based on the impact ionization phenomenon. (c) in FIG. 3 shows, as an inset, an enlarged graph of an area where super-steep switching takes place. Based on the graph, it may be identified that the device according to the present disclosure overcomes the thermionic limit of a CMOS device of 60 mV/dec and rather exhibits an SS value of 2.73 mV/dec.

(d) in FIG. 3 is a contour diagram of a channel current changing based on the drain voltage and the top gate voltage and shows a steep-switching result measured via the impact ionization. Referring to FIG. 3(d), it may be identified that a critical top gate voltage required for the steep-switching changes based on change in the applied drain voltage (higher than or equal to $V_{BR}$ determined based on a length of the ungated-region). On the contrary, it may be identified when the drain voltage smaller than $V_{BR}$ is applied, the channel current stays at a saturated current.

Example 2: Changes in Characteristic Based on Gate Area Length Adjustment of Super-Steep Switching Device (a) in FIG. 4 is a graph showing change in critical voltage $V_{BR}$ based on change in the length of the first area (Gated region) overlapping the gate electrode and in the length of the second area (Ungated $I^2$ region) non-overlapping the gate electrode.

As shown (a) in in FIG. 4, it may be identified that as both the length of the first area (Gated region) overlapping the gate electrode and the length of the second area (Ungated $I^2$ region) which does not overlap the gate electrode are smaller, the critical voltage $V_{BR}$ decreases.

However, since device characteristic must be based on the critical voltage as well as the On/Off ratio, and the SS value, the probability of occurrence of impact ionization, the On/Off current ratio, and the SS value, based on the ratio of the length of the first area (Gated region) and the length of the second area (Ungated $I^2$ region) which does not overlap the gate electrode were measured and were shown in (b) to (d) in FIG. 4 respectively.

First, referring to (b) to (d) in FIG. 4, it may be identified that the off current increases as the length of the second area ($L_{ungated}$) decreases, and the On current increases as the length of the first area ($L_{gated}$) decreases. Considering these results, the length of the first area ($L_{gated}$) is fixed to 1 μm, and the length of the second area ($L_{ungated}$) changes. Thus, it may be identified that when the length of the second area ($L_{ungated}$) is in a range of 100 to 400 nm, there is little change in the On current and Off current, the SS value is a remarkably low value of 5 mV/dec or smaller.

However, it is identified that when the ratio of the length of the second area ($L_{ungated}$) to the length of the first area ($L_{gated}$) is smaller than 0.1 (that is, the length of the second area ($L_{ungated}$) is smaller than 100 nm), the Off current suddenly increases such that the On/Off ratio decreases. Thus, the SS value increases.

Further, as shown in (b) in FIG. 4, it may be identified that when the length of the second area is in a range of 100 to 400 nm based on the length of 1 μm of the first area, the probability of occurrence of impact ionization is high. However, it may be identified that when the length of the second area ($L_{ungated}$) is smaller than 100 nm, the probability of occurrence of impact ionization is reduced. It may be identified that when the length of the second area ($L_{ungated}$) exceeds 400 nm, the steep-switching does not occur.

From these results, it may be identified that when the ratio of the length of the first area and the length of the second area is in a range of 1:0.1 to 0.4 in accordance with the present disclosure, the On/Off ratio of the device and the SS value of the device may be optimized.

FIG. 5 is a graph showing a change in breakdown voltage ($V_BR$) according to a change in a length ($L_{ungated}$, nm) of the second area under the same $V_{GS}$ condition (−3 V).

As shown in FIG. 5, it can be seen that a lower breakdown voltage may be secured by reducing the length of the second area.

FIG. 6 is a graph showing $I_{DS}$ according to $V_{GS}$ under a condition of having $V_{DS}$ of 3 V and a second area length ($L_{ungated}$) of 45 nm.

As shown in FIG. 6, it can be seen that an SS value is 2.9 mV/dec and a $V_{TH}$ value is −0.38 V. In addition, it can be seen that $V_{TH}$ ($V_{GS}$) decreases as the length of the second area decreases as compared with (d) of FIG. 3.

FIG. 7 is a graph showing $I_{DS}$ according to $V_{DS}$ under each of a condition of having $V_{DS}$ of 3 V and a second area length ($L_{ungated}$) of 40 nm and a condition of having $V_{DS}$ of 3 V and a second area length ($L_{ungated}$) of 45 nm.

As shown in FIG. 7, it can be seen that $V_{BR}$ ($V_{DS}$) decreases as the length of the second area decreases. In addition, it can be seen that $V_{BR}$ ($V_{DS}$) decreases as the length of the second area decreases as compared with (c) of FIG. 3.

FIG. 8 is a graph showing a change in threshold voltage according to a change in the length of the second area.

As shown in FIG. 8, it can be seen that a threshold voltage ($V_{GS}$) also decreases as the length of the second area decreases from 300 nm to 30 nm.

Example 3: Implementation and Analysis of Impact Ionization Characteristic of Two-Dimensional Semiconductor (a) and (b) in FIG. 9 are respectively graphs showing transfer characteristic (ID-VG) and output characteristic (ID-VD) of $WSe_2$ having impact ionization characteristic.

Referring to (a) and (b) of FIG. 9, the impact ionization phenomenon due to a sharp increase in current under a high voltage (avalanche bias) of $V_{DS}$<−15 V may be identified.

(c) in FIG. 9 is a graph showing a result of analyzing the impact ionization characteristic of $WSe_2$.

The impact ionization characteristic was analyzed based on a following equation:

$$M = \left(1 \Big/ \left(1 - \left(\frac{E}{E_{CR}}\right)^n\right)\right) \quad <\text{Equation}> \quad 5$$

where M is a multiplication factor, E is an electric field intensity, $E_{CR}$ is a critical electric field intensity, and n is an index related to an ionization scattering cross section).

Referring to (c) of FIG. 9, it may be identified that $WSe_2$ exhibits a high multiplication factor value of up to 5000 and a low critical electric field intensity (Critical E-field) value of 25 kV/cm, and thus $WSe_2$ is an optimized material having the impact ionization.

(d) in FIG. 9 shows changes in critical voltage $V_{BR}$ and critical electric field intensity $E_{CR}$ based on the length of the semiconductor channel according to the present disclosure. As shown in (d) in FIG. 9, it may be identified that an operation voltage may be lowered as the semiconductor channel length is reduced.

(e) in FIG. 9 shows the change in the critical electric field intensity $E_{CR}$ and the multiplication factor based on a thickness of the semiconductor channel according to the present disclosure. As shown in (e) in FIG. 9, it may be identified that as the thickness of the semiconductor channel decreases, the energy bandgap of the channel increases, and accordingly, the critical electric field intensity $E_{CR}$ also increases. Further, for comparison, regarding the multiplication factor under the same electric field condition (E=52 kV/cm), it may be identified that the multiplication factor decreases as the thickness of the semiconductor channel decreases.

(f) in FIG. 9 shows the change in the impact ionization characteristic based on a temperature. Only a small change of about 2.5 KV/cm may be observed based on the temperature change of 100 to 300 K. This corresponds to $2.5 \times 10^{-4}$ V/mm. Thus, the change in the operation voltage is 0.075 V at a channel length of about 300 nm. This supports the reason why the super-steep switching device according to the present disclosure operates even at room temperature.

Example 4: Inverter Device Having High Inverter Gain and Ideal Noise Margin (a) in FIG. 10 is a schematic diagram and a circuit diagram of an inverter device according to one embodiment of the present disclosure in which a super-steep switching device and a pull-up transistor capable of performing a complementary operation therewith are connected in series with each other. In this regard, $V_{In}$ denotes the top gate voltage and $V_{out}$ denotes an output voltage between two transistors.

(b) in FIG. 10 is a graph showing the transfer characteristic (ID-VG) of the inverter device according to one embodiment of the present disclosure. It may be identified that the inverter device has two stable logic state areas based on the complementary operation, based on a gate voltage of a green dot.

(c) in FIG. 10 shows the $V_{out}$-$V_{in}$ curve of the inverter device. Based on the curve, the inverter device operation in the series connection circuit structure of the two transistors may be identified. Further, referring to (c) in FIG. 10, it may be identified that the inverter device has the high inverter gain value (Peak gain~73) and the ideal noise margin (NML+NMH~98.65% of VDD) resulting from the super-steep switching phenomenon.

Example 5: Identification of Materials Usable as a Semiconductor Channel

FIG. 11 is a graph showing an $I_{DS}$ measured according to $V_{GS}$ for a device having a semiconductor channel material $MoS_2$, a semiconductor channel length of 2.5 µm, a semiconductor channel width of 5 µm, and a second area (Ungated) length of 390 nm.

FIG. 12 is a graph showing an $I_{DS}$ measured according to $V_{GS}$ for a device having a semiconductor channel material InSe, a semiconductor channel length of 5 µm, a semiconductor channel width of 3.5 µm, and a second area (Ungated) length of 370 nm.

FIG. 13 is a graph showing an $I_{DS}$ measured according to $V_{GS}$ for a device having a semiconductor channel material InSe, a semiconductor channel length of 5 µm, a semiconductor channel width of 2.5 µm, and a second area (Ungated) length of 100 nm.

FIG. 14 is a graph showing an $I_{DS}$ measured according to $V_{GS}$ for a device having a semiconductor channel material BP, a semiconductor channel length of 5.5 µm, a semiconductor channel width of 1 µm, and a second area (Ungated) length of 170 nm.

FIG. 15 is a graph showing an $I_{DS}$ measured according to $V_{GS}$ for a device having a semiconductor channel material $ZrSe_2$, a semiconductor channel length of 1 µm, a semiconductor channel width of 0.5 µm, and a second area (Ungated) length of 180 nm.

FIG. 16 is a graph showing an $I_{DS}$ measured according to $V_{GS}$ for a device having a semiconductor channel material $ZrSe_2$, a semiconductor channel length of 1 µm, a semiconductor channel width of 0.5 µm, and a second area (Ungated) length of 180 nm.

From FIGS. 11 to 16, an SS value and an on/off ratio value were measured for each device, and the measured results are summarized through <Table 1> below.

TABLE 1

| Material | Channel length | Channel width | Ungated-region length | SS (mV/dec) | On/off ratio ($10^x$) |
|---|---|---|---|---|---|
| $MoS_2$ | 2.5 µm | 5 µm | 390 nm | 30.44 | 1 |
| InSe | 5 µm | 3.5 µm | 370 nm | 11.47 | 1 |
|  | 5 µm | 2.5 µm | 100 nm | 13.32 | 1 |
| BP | 5.5 µm | 1 µm | 170 nm | 34.57 | 2.5 |
| $ZrSe_2$ | 1 µm | 0.5 µm | 180 um | 18.16 | 6 |
|  | 1 µm | 0.5 µm | 180 um | 27.71 | 5 |
| $WSe_2$ | 3 µm | 2.5 µm | 300 nm | 2.73 | 6 |

As shown in FIGS. 11 to 16 and <Table 1>, it can be seen that $I^2$FET may be implemented using various two-dimensional materials.

However, in the case of $MoS_2$ and InSe, there is a problem in that the on/off ratio is low, and in the case of BP and $ZrSe_2$, there is a problem in that on-current is low. However, in the case of $WSe_2$, it can be seen that both of the above-described problems may be solved and a low operating voltage may be achieved.

Although the above description has been made with reference to a preferred embodiment of the present disclosure, those skilled in the art may variously modify and change the present disclosure without departing from the spirit and scope of the present disclosure as described in the claims below.

What is claimed is:

1. A super-steep switching device comprising:
a semiconductor channel disposed on a substrate and formed of a semiconductor material having an impact ionization property;
a source electrode and a drain electrode, which are contacted with the semiconductor channel and spaced apart from each other on the substrate;
a gate electrode only overlapping a portion of the semiconductor channel; and
an insulating layer disposed between the gate electrode and the semiconductor channel and covering an entire surface of the semiconductor channel,
wherein a top surface of the semiconductor channel comprises a first area overlapping the gate electrode, and a second area not overlapping the gate electrode,
wherein the first area has the length of 1 μm and the second area has the length in a range of 100 to 400 nm,
wherein the gate electrode is formed only on the portion of the semiconductor channel adjacent to the source electrode,
wherein the semiconductor channel is formed of a two-dimensional semiconductor material being $WSe_2$,
wherein a Subthreshold Swing value of the super-steep switching device is 3.5~4.0 mV/dec,
wherein a voltage for generating an electric field having an intensity higher than a critical electric field intensity, and lower than a breakdown electric field intensity is applied to the drain electrode, wherein the critical electric field intensity is a minimum electric field intensity at which avalanche carrier multiplication occurs in the first area, wherein the breakdown electric field intensity is an electric field intensity at which breakdown occurs in the first area, and
wherein a gate voltage is applied to the gate electrode simultaneously with the application of the voltage to the drain electrode, such that the avalanche carrier multiplication phenomenon occurs in the first area.

2. An inverter device comprising:
a super-steep switching device according to claim 1; and
a pull-up transistor connected in series with the super-steep switching device and capable of operating complementarily with the super-steep switching device.

3. The inverter device of claim 2,
wherein a gate electrode of the pull-up transistor and the gate electrode of the super-steep switching device are electrically connected to each other so that the same gate voltage is applied thereto.

4. The inverter device of claim 2,
wherein a semiconductor layer of the pull-up transistor is made of n-type semiconductor material,
wherein the n-type semiconductor material includes one selected from a group consisting of molybdenum disulfide ($MoS_2$), indium selenide ($In_2Se_3$), rhenium disulfide ($ReS_2$) and molybdenum diselenide ($MoSe_2$).

5. The super-steep switching device of claim 1, wherein the second area has the length in a range of 200 to 300 nm.

* * * * *